United States Patent
Ota et al.

(10) Patent No.: US 7,320,815 B2
(45) Date of Patent: Jan. 22, 2008

(54) METHOD FOR FORMING ORIENTED FILM, ORIENTED FILM, SUBSTRATE FOR ELECTRONIC DEVICE, LIQUID CRYSTAL PANEL, AND ELECTRONIC DEVICE

(75) Inventors: Hidenobu Ota, Suwa (JP); Yukihiro Endo, Suwa (JP)

(73) Assignee: Seiko Epson Corporation (JP)

( * ) Notice: Subject to any disclaimer, the term of this patent is extended or adjusted under 35 U.S.C. 154(b) by 345 days.

(21) Appl. No.: 10/931,803

(22) Filed: Sep. 1, 2004

(65) Prior Publication Data

US 2005/0084624 A1    Apr. 21, 2005

(30) Foreign Application Priority Data

Sep. 4, 2003    (JP) ............... 2003-313320

(51) Int. Cl.
- *B05D 5/12* (2006.01)
- *C23C 14/48* (2006.01)
- *C23C 14/24* (2006.01)
- *C23C 14/54* (2006.01)
- *C23C 16/26* (2006.01)
- *C23C 16/36* (2006.01)

(52) U.S. Cl. ............ 427/526; 427/528; 427/529; 427/523; 427/249.1; 427/249.7; 427/249.9; 427/58

(58) Field of Classification Search ............ None
See application file for complete search history.

(56) References Cited

U.S. PATENT DOCUMENTS

| | | | | |
|---|---|---|---|---|
| 4,153,529 A | * | 5/1979 | Little et al. ............... | 204/192.3 |
| 4,456,515 A | * | 6/1984 | Krueger et al. ........ | 204/192.27 |
| 4,844,785 A | * | 7/1989 | Kitabatake et al. .... | 204/192.11 |
| 6,061,114 A | * | 5/2000 | Callegari et al. .......... | 349/125 |
| 6,171,343 B1 | * | 1/2001 | Dearnaley et al. ......... | 623/23.6 |
| 6,303,225 B1 | * | 10/2001 | Veerasamy ................. | 428/408 |
| 6,485,614 B2 | * | 11/2002 | Katoh et al. .......... | 204/157.15 |
| 6,613,422 B1 | * | 9/2003 | Ma et al. .................... | 428/212 |
| 6,878,405 B2 | * | 4/2005 | Bienkiewicz et al. .... | 427/249.7 |

(Continued)

FOREIGN PATENT DOCUMENTS

JP    63-282199    * 11/1988    ................ 427/530

(Continued)

OTHER PUBLICATIONS

Translation of JP 63-282199 by Ueno et al., publication date Nov. 18, 1988.*

(Continued)

*Primary Examiner*—Marianne Padgett
(74) *Attorney, Agent, or Firm*—Harness, Dickey & Pierce, P.L.C.

(57) ABSTRACT

A method for forming an oriented film is provided for forming an oriented film on a base material by irradiating the surface of the base material where the oriented film will be formed with an ion beam comprising nitrogen ions from a direction inclined at a prescribed angle $\theta_a$ with respect to the direction perpendicular to the surface, while evaporating carbon from an evaporation source. The prescribed angle, $\theta_a$, is preferably 45-89°. The accelerating voltage of the ion beam comprising nitrogen ions is preferably 100-500 V. The electric current of the ion beam comprising nitrogen ions is preferably 10-500 mA.

8 Claims, 10 Drawing Sheets

U.S. PATENT DOCUMENTS 7,084,946 B2 *    8/2006  Ota et al. ................... 349/123
2001/0029051 A1 * 10/2001  Hyodo et al. ................. 438/3
2002/0063830 A1 *  5/2002  Callegari et al. ........... 349/124

FOREIGN PATENT DOCUMENTS

| JP | 10-161133 | 6/1998 |
| JP | 11-237638 | 8/1999 |
| KR | 1999-0062726 | 7/1999 |

OTHER PUBLICATIONS

G.W. Castellan, Physical Chemistry, Second Edition, Addison-Wesley Publishing Company, Reading Massachusetts, 1971 (no month), excerpt pp. 576-581.*

Communication from Korean Patent Office regarding related application. paper in Korea, mentions 1999-62726 in text, probably Jun. 30, 2006.

* cited by examiner

METHOD FOR FORMING ORIENTED FILM, ORIENTED FILM, SUBSTRATE FOR ELECTRONIC DEVICE, LIQUID CRYSTAL PANEL, AND ELECTRONIC DEVICE

RELATED APPLICATIONS

This application claims priority to Japanese Patent Application No. 2003-313320 filed Sep. 4, 2003 which is hereby expressly incorporated by reference herein in its entirety.

BACKGROUND

1. Technical Field

The present invention relates to a method for forming an oriented film, an oriented film, a substrate for an electronic device, a liquid crystal panel, and an electronic device.

2. Background Art

Projection display devices for projecting images on a screen are known. Liquid crystal panels have been mainly used for forming images in such projection display devices.

Such liquid crystal panels usually have an oriented film set so that a prescribed pretilt angle is demonstrated in order to orient liquid crystal molecules in a fixed direction. A method for the manufacture of such oriented films is known by which a thin film composed of a polymer compound such as a polyimide, which was formed on a substrate, is unidirectionally rubbed with a cloth such as rayon (for example, see JP-A-H10-161133 (Claims)).

However, the oriented films composed of polymer compounds such as polyimides sometimes demonstrate light-induced deterioration under certain working environments and durations of use. If such light-induced deterioration occurs, materials constituting the oriented film, liquid crystal layer, and the like can decompose and the decomposition products can produce an adverse effect on the performance of liquid crystals.

Another problem is that the rubbing treatment produces electrostatic charges and dust, thereby decreasing reliability.

It is an object of the present invention to provide an oriented film that has excellent light resistance and allows for a more reliable control of a pretilt angle, to provide a substrate for an electronic device, a liquid crystal panel, and an electronic device comprising such an oriented film, and to provide a method for forming such an oriented film.

SUMMARY

The above-described object is attained by the following invention.

The method for forming an oriented film in accordance with the present invention is a method for forming an oriented film on a base material, comprising: irradiating the surface of the base material where the oriented film will be formed with an ion beam comprising nitrogen ions from a direction inclined at a prescribed angle, $\theta_a$, with respect to the direction perpendicular to the surface, wherein the irradiation is performed while evaporating carbon from an evaporation source.

As a result, an oriented film that has excellent light resistance and allows for a more reliable control of the pretilt angle can be obtained.

In the method for forming an oriented film in accordance with the present invention, the prescribed angle $\theta_a$ is preferably 45-89°.

In this case, an oriented film that allows for a more reliable control of the pretilt angle can be obtained.

In the method for forming an oriented film in accordance with the present invention, the accelerating voltage of the ion beam comprising the nitrogen ions is preferably 100-500 V.

In this case, an oriented film comprising carbon atoms and nitrogen atoms can be formed more efficiently.

In the method for forming an oriented film in accordance with the present invention, the electric current of the ion beam comprising the nitrogen ions is preferably 10-500 mA.

In this case, an oriented film comprising carbon atoms and nitrogen atoms can be formed more efficiently.

In the method for forming an oriented film in accordance with the present invention, the pressure of the atmosphere during the formation of the oriented film is preferably $5 \times 10^{-2}$ Pa.

In this case, an oriented film can be formed more efficiently.

In the method for forming an oriented film in accordance with the present invention, when the oriented film is formed, the surface of the base material where the oriented film will be formed is preferably irradiated with an ion beam comprising oxygen ions from a direction inclined at a prescribed angle, $\theta_b$, with respect to the direction perpendicular to the surface.

In this case, an oriented film comprising π electrons can be formed more efficiently. Furthermore, the transparency of the oriented film can be increased.

In the method for forming an oriented film in accordance with the present invention, the angle $\theta_a$ and angle $\theta_b$ are preferably substantially equal to each other.

In this case, π electrons can be provided with good orientation ability. As a result the orientation ability of liquid crystal molecules can be improved.

In the method for forming an oriented film in accordance with the present invention, the film formation rate in forming the oriented film is preferably 2-10 nm/min.

In this case, an oriented film can be formed with better efficiency, without loosing the orientation ability of the obtained oriented film.

The oriented film in accordance with the present invention is formed by the method for forming an oriented film in accordance with the present invention.

In this case, an oriented film that has excellent light resistance and allows for a more reliable control of the pretilt angle can be provided.

The oriented film in accordance with the present invention is composed of a material comprising carbon atoms and nitrogen atoms and having unsaturated bonds between carbon atoms and nitrogen atoms.

In this case, an oriented film that has excellent light resistance and allows for a more reliable control of the pretilt angle can be provided.

In the oriented film in accordance with the present invention, the material preferably further comprises oxygen atoms.

In this case, unsaturated bonding can efficiently proceed in the material. Therefore, π electrons easily appear in the vicinity of the oriented film surface and the transparency of the oriented film can be further increased.

In the oriented film in accordance with the present invention, the average thickness of the oriented film is preferably 20-300 nm.

In this case, a more adequate pretilt angle can be demonstrated and the orientation state of liquid crystal molecules can be controlled more advantageously.

The substrate for an electronic device in accordance with the present invention comprises electrodes and the oriented film in accordance with the present invention provided on the substrate.

In this case, a substrate for an electronic device with excellent light resistance can be provided.

The liquid crystal panel in accordance with the present invention comprises the oriented film in accordance with the present invention and a liquid crystal layer.

In this case, a liquid crystal panel with excellent light resistance can be provided.

The liquid crystal panel in accordance with the present invention comprises a pair of the oriented films in accordance with the present invention and also comprises a liquid crystal layer between the pair of oriented films.

In this case, a liquid crystal panel with excellent light resistance can be provided.

The electronic device in accordance with the present invention comprises the liquid crystal panel in accordance with the present invention.

In this case, a highly reliable electronic device can be provided.

The electronic device in accordance with the present invention has a light valve comprising the liquid crystal panel in accordance with the present invention and projects images by using at least one such light valve.

In this case, a highly reliable electronic device can be provided.

The electronic device in accordance with the present invention comprises three light valves corresponding to red color, green color, and blue color for forming images, a light source, a color separation optical system for separating the light from the light source into red, green, and blue lights, and guiding each such light into the corresponding light valve, a color synthesizing optical system for synthesizing each image, and a projecting optical system for projecting the synthesized image, wherein the light valve comprises the liquid crystal panel in accordance with the present invention.

In this case, a highly reliable electronic device can be provided.

The present invention can provide an oriented film that has excellent light resistance and allows for a more reliable control of a pretilt angle, a substrate for an electronic device, a liquid crystal panel, and an electronic device comprising such an oriented film, and a method for forming such an oriented film.

DETAILED DESCRIPTION

The method for forming an oriented film, substrate for an electronic device, a liquid crystal panel, and an electronic device in accordance with the present invention will be described below in greater detail with reference to the appended drawings.

Prior to explaining the method for forming an oriented film, the liquid crystal panel in accordance with the present invention will be explained.

Figure 1:
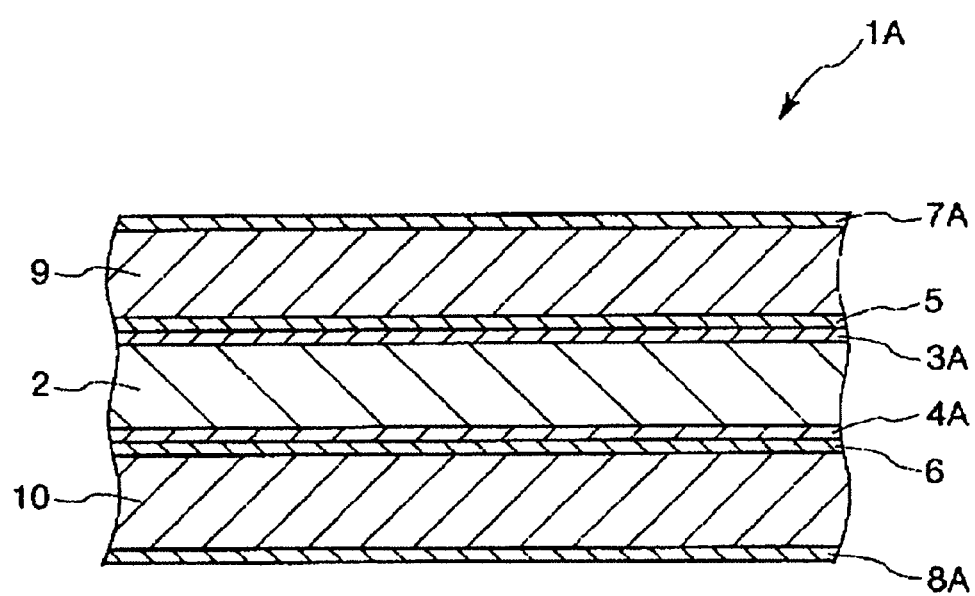
FIG. 1 is a schematic longitudinal sectional view illustrating the first embodiment of the liquid crystal panel in accordance with the present invention.
Figure 2:
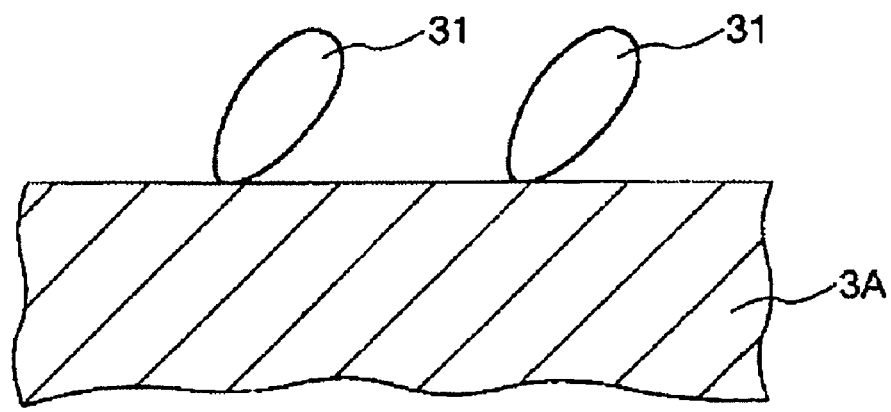
FIG. 2 is a partial longitudinal sectional view schematically illustrating the surface state of an oriented film formed by the method in accordance with the present invention.

FIG. 1 is a schematic longitudinal sectional view illustrating the first embodiment of the liquid crystal panel in accordance with the present invention. FIG. 2 is a partial longitudinal sectional view illustrating schematically the surface state of an oriented film formed by the method in accordance with the present invention.

As shown in FIG. 1, a liquid crystal panel 1A comprises a liquid crystal layer 2, oriented films 3A, 4A, transparent electrically conductive films 5, 6, polarizing films 7A, 8B, and substrates 9, 10.

In such configuration, the substrate for an electronic device in accordance with the present invention (substrate 200 for an electronic device) is composed of the substrate 9, transparent electrically conductive film 5 (electrode), and oriented film 3A, and substrate 10, transparent electrically conductive film 6 (electrode), and oriented film 4A, respectively The liquid crystal layer 2 is composed substantially of liquid crystal molecules.

Any liquid crystal liquid molecules capable of orientation, such as nematic liquid crystals and smectic liquid crystals, may be used as liquid crystal molecules constituting the liquid crystal layer 2. In case of a TN-type liquid crystal panel, it is preferred that nematic liquid crystals be formed, examples thereof including phenylcyclohexane derivative liquid crystals, biphenyl derivative liquid crystals, biphenylcyclohexane derivative liquid crystals, bicyclohexane derivative liquid crystals, terphenyl derivative liquid crystals, phenyl ether derivative liquid crystals, phenyl ester derivative liquid crystals, bicyclohexane derivative liquid crystals, azomethine derivative liquid crystals, azoxy derivative liquid crystals, pyrimidine derivative liquid crystals, dioxane derivative liquid crystals, and cubane derivative liquid crystals. Those nematic liquid crystal molecules also include liquid crystal molecules obtained by introducing a fluorine-containing substituent such as a monofluoro group, difluoro group, trifluoro group, trifluoromethyl group, trifluoromethoxy group, and difluoromethoxy group.

Oriented films 3A, 4A are disposed on both surfaces of the liquid crystal layer 2.

Further, the oriented film 3A is formed on a base material 100 composed of the below-described transparent electrically conductive film 5 and substrate 9, and the oriented film 4A is formed on a base material 101 composed of the below-described transparent electrically conductive film 6 and substrate 10.

The oriented films 3A, 4A have a function of controlling the orientation state (when no voltage is applied) of liquid crystal molecules constituting the liquid crystal layer 2.

The oriented films 3A, 4A have virtually the identical configuration, and the explanation below will be conducted with respect to the oriented film 3A.

The oriented film 3A is composed substantially of a material composed of carbon atoms and nitrogen atoms (inorganic material). Because such materials generally have chemical stability superior to that of organic materials such as polyamides that have been widely used as constituent materials of oriented films, they have an especially good light resistance by comparison with the conventional oriented films composed of organic materials.

In particular, the material constituting the oriented film (inorganic oriented film) 3A has unsaturated bonds between carbon atoms and nitrogen atoms. If the oriented film 3A is composed of such a material, then, as shown in FIG. 2, $\pi$ electrons ($\pi$ orbitals) 31 rise with the prescribed directivity in the vicinity of the surface of the oriented film 3A. If the oriented film 3A has such $\pi$ electrons 31 on the surface thereof, the orientation ability of liquid crystal molecules can be increased and an adequate pretilt angle can be demonstrated. This is apparently due to interaction of $\pi$ electrons 31 on the surface of the oriented film 3A and anisotropy of liquid crystal molecules. Thus, this is apparently because when $\pi$ electrons 31 are not present, the liquid crystal molecules are in a state in which they lie idle, but if $\pi$ electrons 31 are present, the liquid crystal molecules easily assume a state in which they are supported by the $\pi$ electrons 31 and raised at the prescribed angle.

The content ratio of C (carbon) in the oriented film 3A is 60-90 at. %, preferably 70-90 at. %. In this case, an especially good light resistance can be obtained. By contrast, if the content ratio of C is less than the above-mentioned lower limit value, sufficient light resistance sometimes cannot be obtained. On the other hand, if the content ratio of C exceeds the aforementioned upper limit value, then the content ratio of N (nitrogen) decreases accordingly. Therefore, the number of unsaturated bonds contained in the material sometimes decreases.

Further, the content ratio of N (nitrogen) in the oriented film 3A is 5-30 at. %, preferably 10-20 at. %. In this case, the orientation ability of liquid crystal molecules can be further increased. By contrast, if the content ratio of N is less than the above-mentioned lower limit value, the number of unsaturated bonds contained in the material sometimes decreases. On the other hand, if the content ratio of N exceeds the aforementioned upper limit value, then the content ratio of C decreases accordingly. Therefore, light resistance of the oriented film 3A can decrease.

The average thickness of the oriented films 3A, 4A is preferably 5-100 nm, more preferably 5-30 nm. If the average thickness is less than the aforementioned lower limit value, it is sometimes difficult to obtain a sufficiently uniform pretilt angle in all the locations. On the other hand, if the average thickness exceeds the aforementioned upper limit value, the drive voltage can rise and power consumption can increase.

In the above-described embodiment, the explanation was conducted with respect to the oriented film 3A composed of a material substantially comprising carbon atoms and nitrogen atoms. However, the oriented film is preferably composed of a material additionally containing oxygen atoms. With such a configuration, unsaturated bonding can efficiency proceed in the material. Therefore, $\pi$ electrons 31 easily appear in the vicinity of the surface of the oriented film 3A and the transparency of the oriented film 3A can be further increased.

When the material constituting the oriented film 3A comprises oxygen atoms, the content ratio of the oxygen atoms in the material is preferably 10 at. % or more, more preferably 20-50 at. %. In this case, the above-described effect is further enhanced.

Further, such oriented films 3A, 4A are formed, for example, by the below-described method (method for forming an oriented film in accordance with the present invention).

The transparent electrically conductive film 5 is disposed on the outer surface side (the surface on the opposite side from the surface that faces the liquid crystal layer 2) of the oriented film 3A. Similarly, the transparent electrically conductive film 6 is disposed on the outer surface side (the surface on the opposite side from the surface that faces the liquid crystal layer 2) of the oriented film 4A.

The transparent electrically conductive films 5, 6 have a function of driving (changing the orientation) the liquid crystal molecules of the liquid crystal layer 2 by providing conductivity therebetween.

Control of the conductivity between the transparent electrically conductive films 5, 6 is carried out by controlling the electric current supplied from a control circuit (not shown in the figures) connected to the transparent electrically conductive films.

The transparent electrically conductive films 5, 6 have electric conductivity and are composed, for example, of indium tin oxide (ITO), indium oxide (IO), or tin oxide ($SnO_2$).

The substrate 9 is disposed on the outer surface side (the surface on the opposite side from the surface that faces the oriented film 3A) of the transparent electrically conductive film 5. Similarly, the substrate 10 is disposed on the outer surface side (the surface on the opposite side from the surface that faces the oriented film 4A) of the transparent electrically conductive film 6.

The substrates 9, 10 have a function of supporting the above-described liquid crystal layer 2, oriented films 3A, 4A, transparent electrically conductive films 5, 6, and the below described polarizing films 7A, 8A. No specific limitation is placed on the materials constituting the substrates 9, 10. Examples of suitable materials include glass such as quartz glass and plastic materials such as polyethylene terephthalate. Among them, glass such as quartz glass is especially preferred. In this case, it is possible to obtain a liquid crystal panel with better stability and high resistance to deflection. The description of sealing materials, wiring, and the like with reference to FIG. 1 is omitted.

The polarizing film 7A (polarizing plate) is disposed on the outer surface side (the surface on the opposite side from the surface that faces the transparent electrically conductive film 5) of the substrate 9. Similarly, the polarizing film 8A (polarizing plate) is disposed on the outer surface side (the surface on the opposite side from the surface that faces the transparent electrically conductive film 6) of the substrate 10.

Polyvinyl alcohol (PVA) is an example of material constituting the polarizing films 7A, 8A. A material obtained by doping the aforementioned material with iodine may be also used for the polarizing film.

For example, a film composed of the aforementioned material and subjected to uniaxial stretching can be used as the polarizing film.

Disposing such polarizing films 7A, 8A makes it possible to conduct more reliable control of light transmittance by adjusting the degree of conductivity.

The directions of the polarization axes of polarizing films 7A, 8A are usually determined according to the orientation directions of oriented films 3A, 4A.

The first embodiment of the method for forming an oriented film in accordance with the present invention will be described below.

Figure 3:
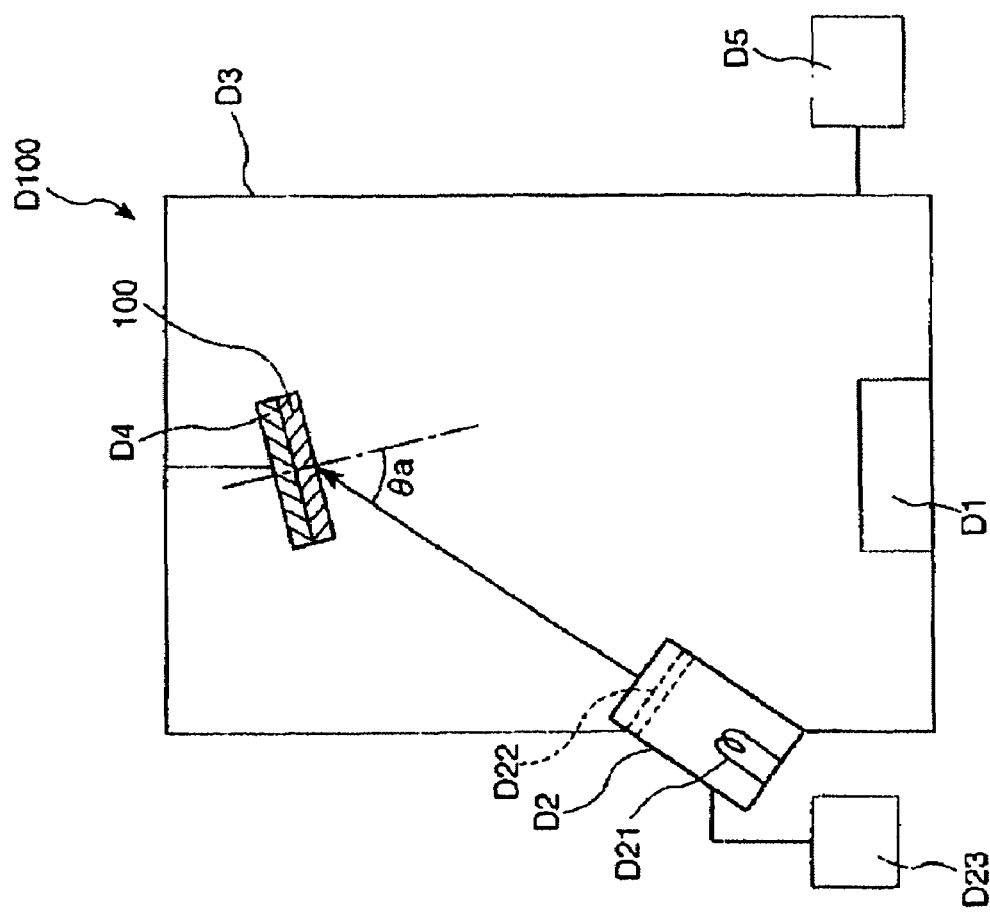
FIG. 3 is a schematic diagram of a film forming apparatus used for forming an oriented film.

FIG. 3 is a schematic drawing of a film forming apparatus used for forming an oriented film on a base material.

The film forming apparatus D100 shown in FIG. 3 comprises an evaporation source D1 for evaporating carbon, an ion source D2 for emitting an ion beam, a vacuum chamber D3, a base material holder D4 for fixing the base material inside the vacuum chamber D3, and an evacuation pump D5 for controlling the pressure inside the vacuum chamber S1.

The ion source D2 has a filament D21 and a draw-out electrode D22 inside thereof. Furthermore, a gas supply source D23 for supplying nitrogen gas into the ion source D2 is connected to the ion source D2.

The formation of the oriented film 3A on the base material 100 by using the above-described film forming apparatus will be schematically described below.

1. The base material 100 is disposed on the base material holder D4 so as to be in contact with the base material holder D3.

2. The vacuum chamber D3 is evacuated with the evacuation pump D5.

3. Nitrogen gas is supplied from the gas supply source D23 into the ion source D2.

4. A voltage is applied from a power source (not shown in the figure) to the filament D21 and thermal electrons are generated.

5. The generated thermal electrons collide with the introduced nitrogen gas, the nitrogen gas is ionized, and plasma (nitrogen ions) is generated.

6. An ion accelerating voltage is applied to the draw-out electrode 22, the nitrogen ions are accelerated, and an ion beam is emitted toward the base material 100. The ion beam is emitted onto the surface of the base material 100 where the oriented film 3A will be formed from the direction inclined at the prescribed angle, $\theta_a$, to the direction perpendicular to the aforementioned surface.

7. Simultaneously with the ion beam irradiation, carbon evaporated by heating the evaporation source D1 adheres to the base material 100 and the oriented film 3A comprising carbon atoms and nitrogen atoms is formed.

The base material holder D4 is moved or rotated in advance so that surface of the base material 100 where the oriented film 3A will be formed is irradiated with the ion beam emitted from the ion source D2 from the direction inclined at the prescribed angle (irradiation angle), $\theta_a$, to the direction perpendicular to the aforementioned surface, but the base material holder may be also moved or rotated so that the irradiation angle becomes $\theta_a$, while emitting the ion beam.

The inventors have discovered that irradiating the surface of the base material where the oriented film will be formed with an ion beam comprising nitrogen ions from the direction inclined at the prescribed angle, $\theta_a$, to the direction perpendicular to the aforementioned surface, while simultaneously evaporating carbon, makes it possible to increase the orientation ability of liquid crystal molecules and control the pretilt angle more reliably in the oriented film obtained (oriented film comprising carbon atoms and nitrogen atoms). This is apparently because forming the film under such conditions causes π electrons (π orbitals) to rise, as shown in FIG. 2, on the surface of the oriented film obtained, and this provides for orientation ability of liquid crystal molecules due to interaction of those π electrons and anisotropy of liquid crystal molecules.

Even when the material for constituting the oriented film comprises only carbon atoms, a film comprising such π electrons apparently can be formed by controlling the film formation conditions, but in this case no conditions will allow a film comprising π bonds to be formed with good efficiency. By contrast, in accordance with the present invention, additionally introducing at least nitrogen atoms into the material allows a film comprising π bonds to be formed with good efficiency.

In particular, π electrons can be provided with good orientation ability by irradiating with the ion beam from the direction inclined with respect to the base material. In this case, the orientation ability of liquid crystal molecules is especially improved.

No specific limitation is placed on the irradiation angle, $\theta_a$, but it is preferably 45-89°, more preferably 80-85°. In this case the effect of the present invention is more significant.

The pressure inside the vacuum chamber D3, that is, the pressure of the atmosphere when the oriented film 3A is formed, is preferably $5 \times 10^{-2}$ Pa or less, more preferably $1 \times 10^{-2}$ Pa or less. In this case, the oriented film 3A can be formed more efficiently. If the pressure inside the vacuum chamber D3 is too high, there is a possibility that a sufficiently uniform film will not be formed.

No specific limitation is placed on the electric current of the ion beam (ion beam current) comprising nitrogen ions, but it is preferably 10-500 mA, more preferably 100-200 mA. In this case, the oriented film 3A comprising carbon atoms and nitrogen atoms can be formed with higher efficiency. By contrast, if the ion beam current is less than the aforementioned lower limit value, then a sufficient content ratio of carbon atoms is sometimes difficult to obtain. On the other hand, if the ion beam current exceeds the aforementioned upper limit value, there is a possibility that a sufficiently uniform film will not be formed.

No specific limitation is placed on the ion accelerating voltage applied to the draw-out electrode D22, but it is preferably 100-500 V, more preferably 150-300 V. In this case, the oriented film 3A comprising carbon atoms and nitrogen atoms can be formed with higher efficiency. By contrast, if the ion accelerating voltage is less than the aforementioned lower limit value, then a sufficient content ratio of carbon atoms is sometimes difficult to obtain. On the other hand, if the ion accelerating voltage exceeds the aforementioned upper limit value, there is a possibility that a sufficiently uniform film will not be formed.

The temperature of the base material 100 is preferably comparatively low when the oriented film 3A is formed. More specifically, the temperature of the base material 100 is preferably 150° C. or below, more preferably 100° C. or below, even more preferably 85-50° C. As a result, the migration effect, that is, the movement of the particles (particles composed of carbon atoms or particles composed of carbon atoms and nitrogen atoms) that adhered to the base material 100 from the position to which they have initially adhered, can be inhibited and a function of controlling the orientation ability of liquid crystal molecules of the oriented film 3A that will be finally obtained can be further enhanced. Further, if necessary, cooling may be employed to obtain the temperature of the base material 100 within the aforementioned range when the oriented film 3A is formed.

No specific limitation is placed on the formation rate (film formation rate) of the oriented film 3A, but it is preferably 2-10 nm/min, more preferably 2-3 nm/min. As a result, the oriented film 3A can be formed with good efficiency, without loosing the orientation ability of the oriented film 3A obtained.

The explanation provided hereinabove related to the formation of the oriented film 3A, but the oriented film 4A can be formed in the same manner.

A second embodiment of the method for forming an oriented film in accordance with the present invention will be described below.

The explanation below will focus on the differences in the method for forming an oriented film between this embodiment and the above-described embodiment and an explanation of similar features will be omitted.

Figure 4:
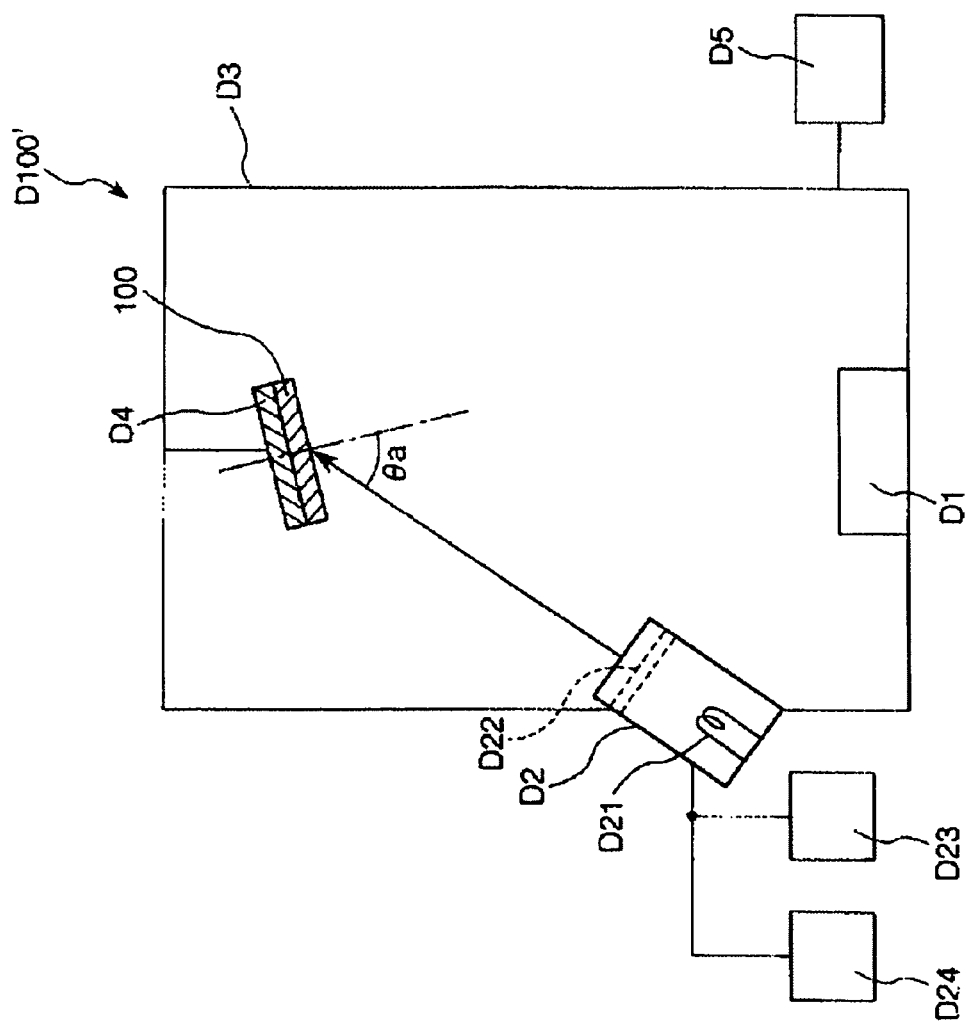
FIG. 4 is a schematic diagram of a film forming apparatus used for forming an oriented film.

FIG. 4 is a schematic diagram of a film forming apparatus used for forming an oriented film.

In the configuration of the present embodiment which is illustrated by the figure, a film forming apparatus D100' comprises a gas supply source D24 for supplying oxygen gas in addition to the gas supply source D23 for supplying nitrogen gas. Thus, the apparatus is configured to irradiate the base material 100 with an ion beam comprising nitrogen ions and oxygen ions. In this case, the oriented film obtained comprises C (carbon), N (nitrogen), and O (oxygen).

Figure 5:
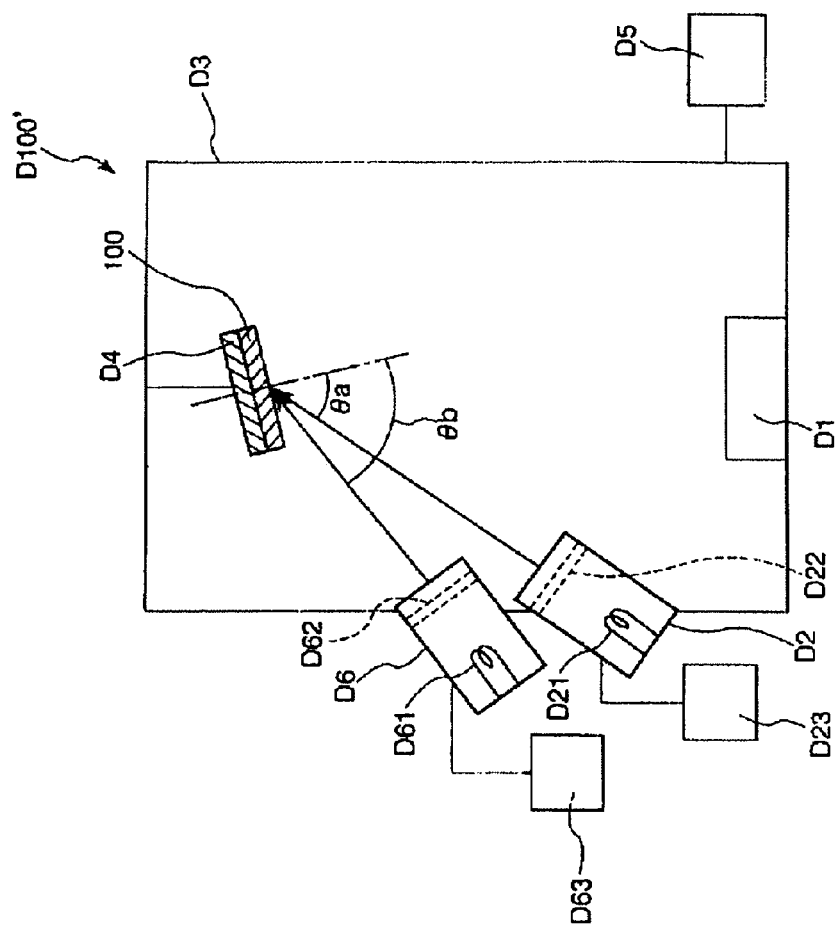
FIG. 5 is a schematic diagram of a film forming apparatus used for forming an oriented film.

In another embodiment, a film forming apparatus shown in FIG. 5 may be used for forming the film.

Thus, in the above-described second embodiment, the explanation was conducted by assuming that nitrogen gas and oxygen gas were supplied so as to be mixed and that irradiation was conducted with an ion beam comprising nitrogen ions and oxygen ions. However, nitrogen ions and oxygen ions may also be emitted as separate ion beams from separate respective ion sources.

In this case it is preferred that $\theta_a$ and $\theta_b$ are substantially equal, where $\theta_a$ stands for the irradiation angle of an ion beam of nitrogen ions and $\theta_b$ stands for the irradiation angle of an ion beam of oxygen ions. More specifically it is preferred that the absolute value of the difference between $\theta_a$ and $\theta_b$ be 10° or less. In this case, $\pi$ electrons can be provided with good orientation ability. As a result, the orientation ability of liquid crystal molecules can be further improved.

The method for forming an oriented film in accordance with the present invention was described above, but the above-described ion beam may also contain argon ions and the like, or irradiation with an ion beam of argon ions may be conducted by using a separate ion source. In this case, an oriented film comprising $\pi$ electrons can be formed with better efficiency.

The second embodiment of the liquid crystal panel in accordance with the present invention will be described below.

Figure 6:
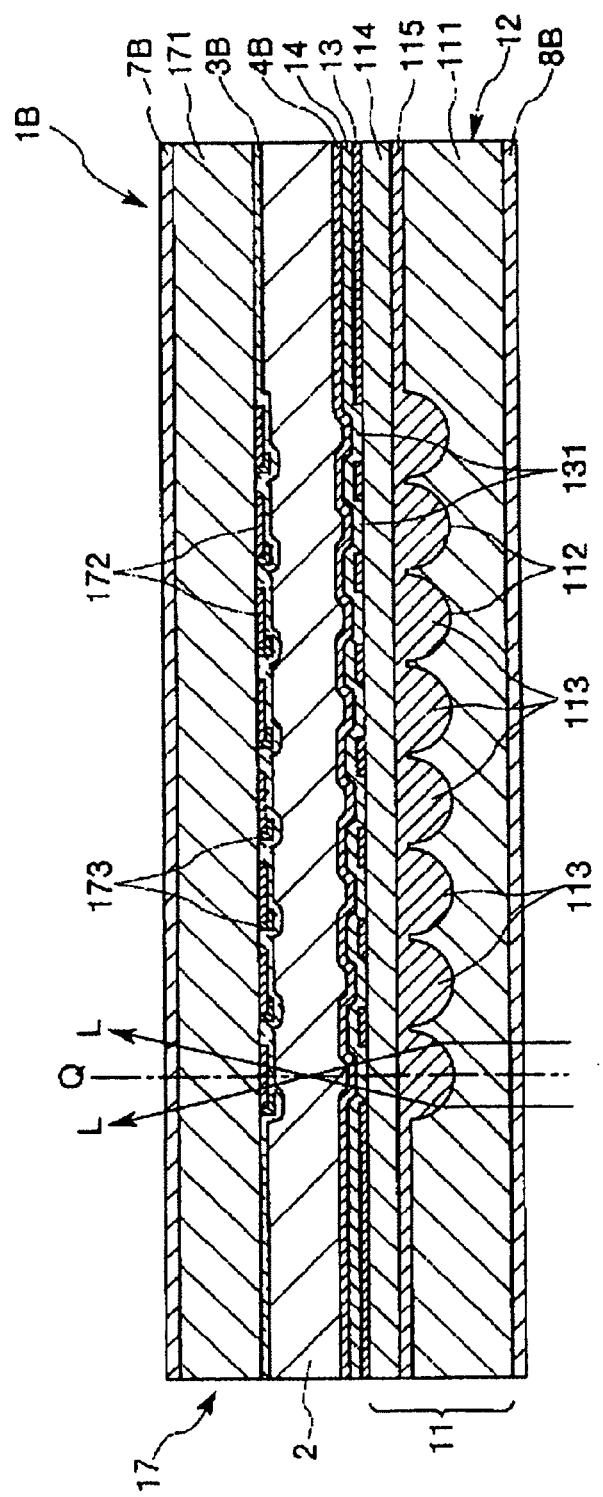
FIG. 6 is a schematic longitudinal sectional view illustrating the second embodiment of the liquid crystal panel in accordance with the present invention.

FIG. 6 is a schematic longitudinal cross-sectional view illustrating the second embodiment of the liquid crystal panel in accordance with the present invention. The liquid crystal panel 1B shown in FIG. 6 will be explained hereinbelow mainly with respect to the differences from the above-described first embodiment, and an explanation of features common to the two embodiments will be omitted.

As shown in FIG. 6, the liquid crystal panel (TFT liquid crystal panel) 1B comprises a TFT substrate (liquid crystal drive substrate) 17, an oriented film 3B joined to the TFT substrate 17, a facing substrate 12 for the liquid crystal panel, an oriented film 4B joined to the facing substrate 12 for the liquid crystal panel, a liquid crystal layer 2 composed of liquid crystals and sealed in the gap between the oriented film 3B and oriented film 4B, a polarizing film 7B joined to the outer surface side (surface on the opposite side from the surface facing the oriented film 4B) of the TFT substrate (liquid crystal drive substrate) 17, and a polarizing film 8B joined to the outer surface side (surface on the opposite side from the surface facing the oriented film 4B) of the facing substrate 12 for the liquid crystal panel. The oriented films 3B, 4B are formed by the same method (the method for forming an oriented film in accordance with the present invention) as the oriented films 3A, 4A described in the first embodiment hereinabove, and the polarizing films 7B, 8B are identical to the polarizing films 7A, 8A described in the first embodiment hereinabove.

The facing substrate 12 for the liquid crystal panel comprises a microlens substrate 11, a black matrix 13 provided on a surface layer 114 of the microlens substrate 11 and having openings 131 formed therein, and a transparent electrically conductive film (common electrode) 14 provided on the surface layer 114 so as to cover the black matrix 13.

The microlens substrate 11 comprises a substrate (first substrate) 111 with recesses for microlenses, which is provided with a plurality (a multiplicity) of recesses (recesses for microlenses) 112, each having a concave curved surface, and a surface layer (second substrate) 114 joined via a resin layer (adhesive layer) 115 to the surface of the substrate 111 where the recesses 112 are provided. In the resin layer 115, microlenses 113 are formed by a resin that fills the recesses 112.

The substrate 111 is produced from a flat starting material (transparent substrate), and a plurality (a multiplicity) of recesses 112 are formed in the surface thereof. The recesses 112 can be formed, for example, by a dry etching method or a wet etching method by using a mask.

The substrate 111 is formed, for example, from a glass or the like.

It is preferred that the thermal expansion coefficient of the aforementioned starting material be substantially equal to the thermal expansion coefficient of the glass substrate 171 (for example, the ratio of the two thermal expansion coefficients is about 1/10 to 10). In this case, in the liquid crystal panel obtained, warping, deflection, and peeling that may be caused by the difference between the two thermal expansion coefficients when the temperature changes can be prevented.

From this standpoint, it is preferred that the substrate 111 and the glass substrate 171 be composed of the same material. In this case, in the liquid crystal panel obtained, warping, deflection, and peeling that may be caused by the difference between the two thermal expansion coefficients when the temperature changes can be prevented.

In particular, when the microlens substrate 11 is used in a TFT liquid crystal panel of high-temperature polysilicon, it is preferred that the substrate 111 with recesses for microlenses be composed of quartz glass. A TFT liquid crystal panel comprises a TFT substrate as a liquid crystal drive substrate. A quarts glass whose properties minimally change under the effect of the environment in the manufacturing process is preferably used for such TFT substrates. Therefore, if the substrate 111 is accordingly also composed of quartz glass, then a TFT liquid crystal panel with excellent stability characterized by high resistance to warping and deflection can be obtained.

A resin layer (adhesive layer) 115 for covering the recesses 112 is provided on the upper surface of the substrate 111.

The microlenses 113 are formed by filling the recesses 112 with the material constituting the resin layer 115.

The resin layer 115 can be composed, for example, of a resin (adhesive) with a refractive index higher than the refractive index of the material constituting the substrate 111 and can be advantageously composed, for example, of an IR-curable resin such as acrylic resin, epoxy resin, and acryl-epoxy resin.

A flat surface layer 114 is provided on the upper surface of the resin layer 115.

The surface layer (glass layer) 114 can be composed, for example, of glass. In this case, it is preferred that the thermal expansion coefficient of the surface layer 114 be substantially equal (for example, the ratio of the two thermal expansion coefficients is about 1/10 to 10) to the thermal expansion coefficient of the substrate 111. In this way, warping, deflection, or peeling that may be caused by the difference in thermal expansion coefficient between the substrate 111 and the surface layer 114 can be prevented. This effect can be obtained to an even greater extent if the substrate 111 and the surface layer 114 are composed of the same material.

From the standpoint of obtaining required optical properties when the microlens substrate 11 is used for a liquid crystal panel, the thickness of the surface layer 114 is usually selected at about 5-1000 µm, more preferably about 10-150 µm.

The surface layer (barrier layer) 114 can be composed, for example, of a ceramic. Examples of suitable ceramics include nitride ceramics such as AlN, SiN, TiN, and BN, oxide ceramics such as $Al_2O_3$ and $TiO_2$, and carbide ceramics such as WC, TiC, ZrC, and TaC. When the surface layer 114 is composed of a ceramic, no specific limitation is placed on the thickness of the surface layer 114, but this thickness is preferably about 20 nm to 20 µm, more preferably about 40 nm to 1 µm.

If necessary, the surface layer 114 can be omitted.

The black matrix 13 has a light-shielding function and is composed, for example, of a metal such as Cr, Al, Al alloy, Ni, Zn, and Ti, or a resin having carbon or titanium dispersed therein.

The transparent electrically conductive film 14 has electric conductivity and is composed, for example, of indium tin oxide (ITO), indium oxide (IO), or tin oxide ($SnO_2$).

The TFT substrate 17 is a substrate for driving liquid crystals of the liquid crystal layer 2 and comprises a glass substrate 171, a plurality (a multiplicity) of pixel electrodes 172 provided on the glass substrate 171 and arranged in the form of a matrix (row-column configuration), and a plurality (a multiplicity) of thin-film transistors (TFT) 173 corresponding to the pixel electrodes 172. The description of sealing materials, wiring, and the like with reference to FIG. 6 is omitted.

For the reasons described hereinabove, the glass substrate 171 is preferably composed of quartz glass.

The pixel electrodes 172 drive liquid crystals of the liquid crystal layer 2 by charging and discharging the transparent electrically conductive film (common electrode) 14. The pixel electrodes 172 are composed, for example, of a material identical to that of the aforementioned transparent eclectically conductive film 14.

The thin-film transistors 173 are connected to corresponding adjacent pixel electrodes 172. Furthermore, the thin-film transistors 173 are connected to the control circuits (not shown in the figure) to control the electric current supplied to the pixel electrodes 172. Charging and discharging of the pixel electrodes 172 is thereby controlled.

The oriented film 3B is joined to the pixel electrodes 172 of the TFT substrate 17, and the oriented film 4B is joined to the transparent electrically conductive film 14 of the facing substrate 12 for a liquid crystal panel.

The liquid crystal layer 2 comprises liquid crystal molecules and the orientation of those liquid crystal molecules, that is, the orientation of the liquid crystal, changes corresponding to charging and discharging of the pixel electrodes 172.

In such a liquid crystal panel 1B, one microlens 113, one opening 131 of the black matrix 13 corresponding to the optical axis Q of the microlens 113, one pixel electrode 172, and one thin-film transistor 173 connected to the pixel electrode 172 usually correspond to one pixel.

An incident light L traveling from the facing substrate 12 for a liquid crystal panel passes through the substrate 111 and is transmitted via the resin layer 115, surface layer 114, opening 131 of the black matrix 13, transparent electrically conductive film 14, liquid crystal layer 2, pixel electrode 172, and glass substrate 171, while being converged as it passes through the microlens 113. At this time, because the polarizing film 8B is provided on the light incidence side of the microlens substrate 11, when the incident light L passes through the liquid crystal layer 2, the incident light L becomes a linearly polarized light. In this process, the polarization direction of the incident light L is controlled corresponding to the orientation state of liquid crystal molecules of the liquid crystal layer 2. Therefore, the luminosity of the outgoing light can be controlled by causing the incident light L that passed through the liquid crystal panel 1B to pass through the polarizing film 7B.

Thus, the liquid crystal panel 1B comprises microlenses 113 and the incident light L that passed through microlenses 113 is converged and passes through the openings 131 of the black matrix 13. On the other hand, in the portion where the openings 131 of the black matrix 13 have not been formed, the incident light L is shielded. Therefore, in the liquid crystal panel 1B, leakage of the unnecessary light from the portions other than pixels is prevented and the attenuation of the incident light L in the pixel portions is inhibited. As a result, the liquid crystal panel 1B has a high light transmittance in pixel portions.

The liquid crystal panel 1B can be manufactured, for example, by forming the oriented films 3B, 4B respectively on the TFT substrate 17 and facing substrate 12 for a liquid crystal panel that were manufactured by the well-known method, then joining the two via a sealing material (not shown in the figures), injecting liquid crystals into a gap formed therebetween from a sealing hole (not shown in the figure) of the gap, and closing the sealing hole.

In the above-described liquid crystal panel 1B, a TFT substrate was used as a liquid crystal drive substrate, but other liquid crystal drive substrates different from the TFT substrates, for example, TFD substrate and STN substrate, may be also used as the liquid crystal drive substrate.

The liquid crystal panel thus provided with the above-described oriented films can be advantageously used for devices with an intensive light source or devices used outdoors.

An electronic device (liquid-crystal display device) in accordance with the present invention, which comprises the above-described liquid crystal panel 1A, will be described hereinbelow in greater detail based on the embodiment illustrated by FIGS. 7 to 9.

Figure 7:
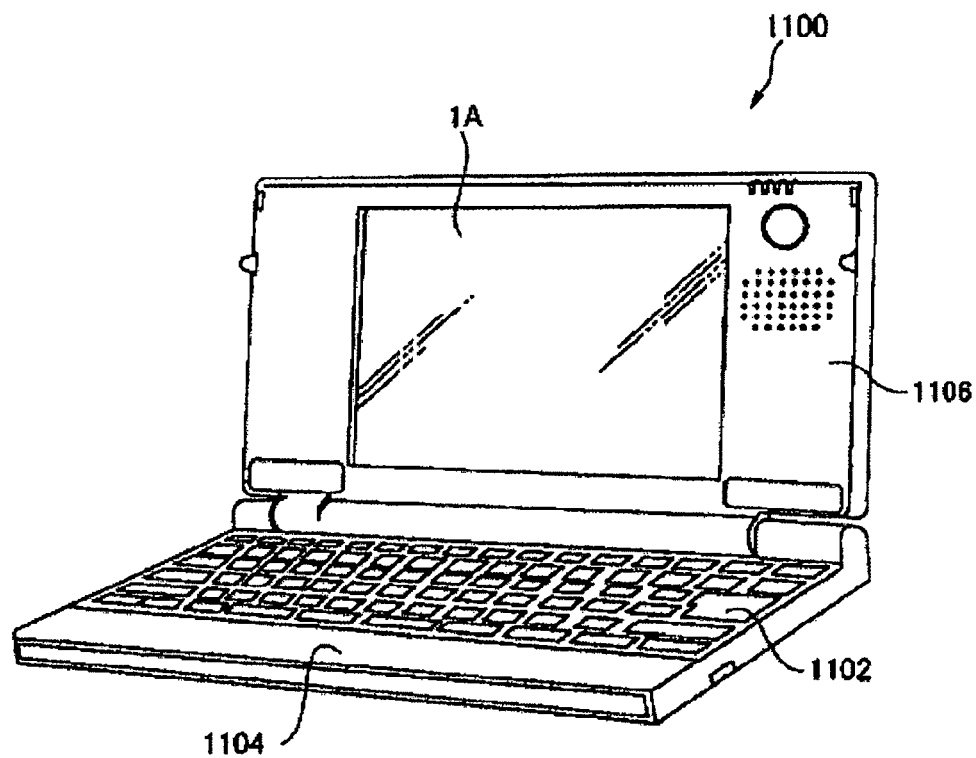
FIG. 7 is a perspective view illustrating the configuration of a mobile (or notebook) personal computer employing the electronic device in accordance with the present invention.

FIG. 7 is a perspective view illustrating the configuration of a personal computer of a mobile (or notebook) type which employs the electronic device in accordance with the present invention.

Referring to this figure, a personal computer 1100 is composed of a main body 1104 equipped with a keyboard 1102 and a display unit 1106, wherein the display unit 1106 is rotatably supported by the main body 1104 via a hinge structure.

In such personal computer 1100, the display unit 1106 comprises the above-described liquid crystal panel 1A and a backlight (not shown in the figure). The light from the backlight is transmitted through the liquid crystal panel 1A, thereby allowing an image (information) to be displayed.

Figure 8:
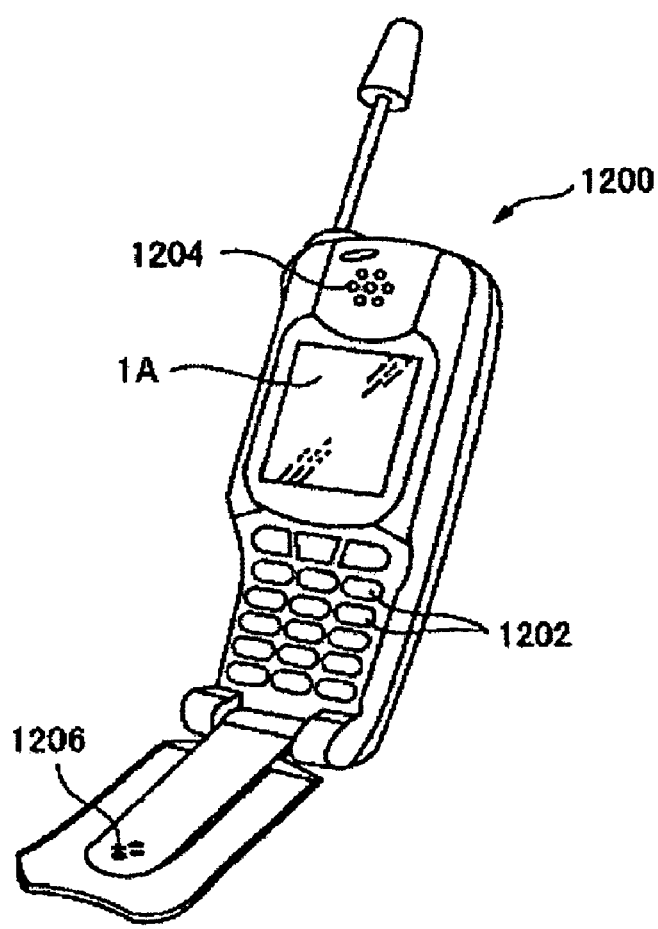
FIG. 8 is a perspective view illustrating the configuration of a cellular phone (including Personal Handyphone System (PHS)) employing the electronic device in accordance with the present invention.

FIG. 8 is a perspective view illustrating the configuration of a cellular phone (including a PHS) type which employs the electronic device in accordance with the present invention.

Referring to this figure, the cellular phone 1200 comprises a plurality of operation buttons 1202, a voice receiving orifice 1204, a voice transmitting orifice 1206, the above-described liquid crystal panel 1A, and a backlight (not shown in the figure).

Figure 9:
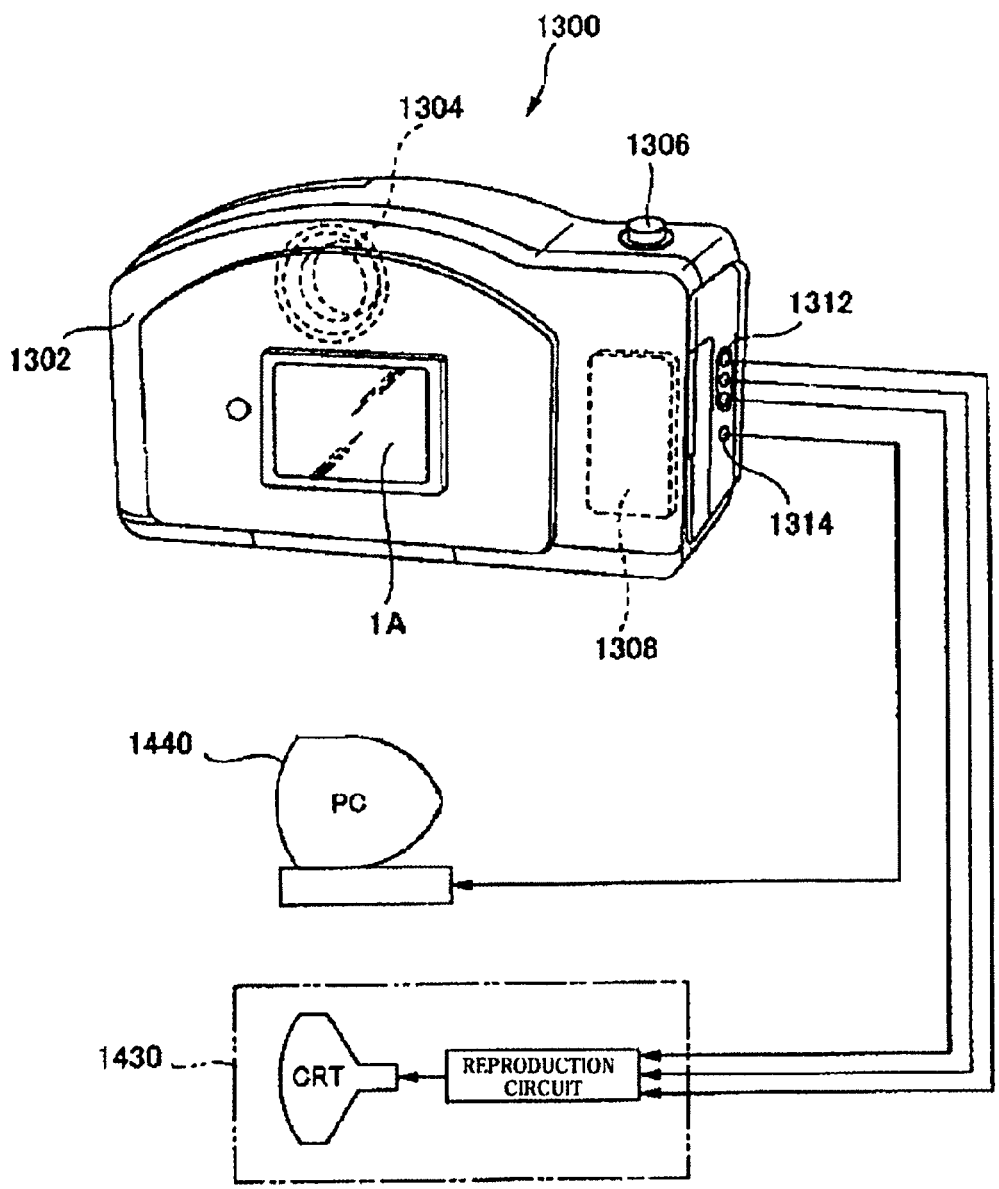
FIG. 9 is a perspective view illustrating the configuration of a digital still camera employing the electronic device in accordance with the present invention.

FIG. 9 is a perspective view illustrating the configuration of a digital still camera which employs the electronic device in accordance with the present invention. Connection to the external device is also shown in the figure in a simple manner.

By contrast with the usual camera in which a photographic film is photosensitized by the optical image of an object, in a digital still camera 1300 the optical image of the object is photoelectrically converted into pickup signals (image signals) by a pickup element such as a CCD (Charge Coupled Device).

The above-described liquid crystal panel 1A and a backlight (not shown in the figure) are provided at the rear surface of the case (body) 1302 of the digital still camera 1300, and display is carried out based on the pickup signals produced by the CCD. The liquid crystal panel 1A functions as a finder for displaying the object as an electronic image.

A circuit substrate 1308 is disposed inside the case. A memory capable of storing (memorizing) imaging signals is disposed at the circuit substrate 1308.

Further, a light-receiving unit 1304 comprising an optical lens (imaging optical system) or CCD is provided on the front surface side (back surface side in the configuration shown in the figure) of the case 1302.

If the photographer recognizes the object displayed on the liquid crystal panel 1A and pushes down the shutter button 1306, the pickup signal of the CCD at this point in time is transferred to and stored in the memory of the circuit substrate 1308.

Further, in the digital still camera 1300, a video signal output terminal 1312 and an input/output terminal 1314 for data communication are provided at the side surface of the case 1302.

Further, as shown in the figure, if necessary, a television monitor 1430 is connected to the video signal output terminal 1312, and a personal computer 1440 is connected to the input/output terminal 1314 for data communication. Furthermore, by the prescribed operations, the imaging signal stored in the memory of the circuit substrate 1308 is outputted to the television monitor 1430 and personal computer 1440.

An electronic device (liquid-crystal projector) using the above-described liquid crystal panel 1B will be described hereinbelow as an example of the electronic device in accordance with the present invention.

Figure 10:
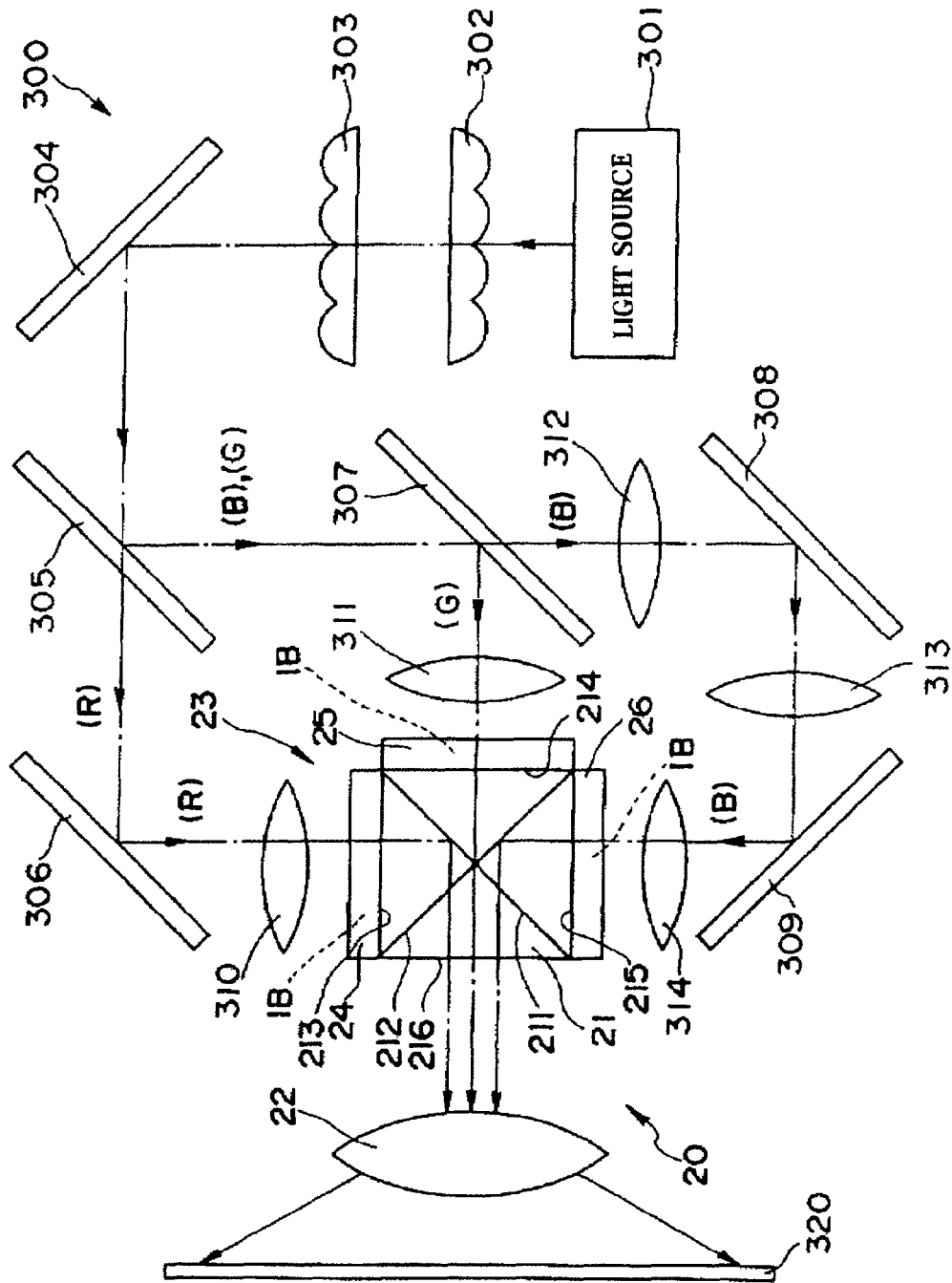
FIG. 10 illustrates schematically the optical system of the projection display device employing the electronic device in accordance with the present invention.

FIG. 10 shows schematically the optical system of the electronic device (projection display device) in accordance with the present invention.

As shown in the figure, a projection display device 300 comprises a light source 301, an illumination optical system comprising a plurality of integrator lenses, a color separation optical system (light guide optical system) comprising a plurality of dichroic mirrors and the like, a liquid crystal light valve (liquid crystal light shutter array) 24 (for red color) corresponding to red color, a liquid crystal light valve (liquid crystal light shutter array) 25 (for green color) corresponding to green color, a liquid crystal light valve (liquid crystal light shutter array) 26 (for blue color) corresponding to blue color, a dichroic prism (color synthesizing optical system) 21 having formed thereon a dichroic mirror surface 211 reflecting only red light and a dichroic mirror surface 212 reflecting only blue light, and a projection lens (projection optical system) 22.

Further, the illumination optical system comprises integrator lenses 302 and 303. The color separation optical system comprises mirrors 304, 306 and 309, a dichroic mirror 305 reflecting blue light and green light (transmitting only red light), a dichroic mirror 307 reflecting only green light, a dichroic mirror 308 reflecting only blue light (or mirror reflecting only blue light), and converging lenses 310, 311, 312, 313, and 314.

The liquid crystal light valve 25 comprises the above-described liquid crystal panel 1B. The liquid crystal light valves 24 and 26 have a configuration similar to that of the liquid crystal light valve 25, and the liquid crystal panels 1B comprised in those liquid crystal light valves 24, 25, and 26 are connected to respective drive circuits (not shown in the figures).

Further, in the projection display device 300, the optical block 20 is composed of a dichroic prism 21 and projection lens 22. Further, the display unit 23 is composed of the optical block 20 and the liquid crystal light valves 24, 25, and 26 disposed fixedly with respect to the dichroic prism 21.

The operation of the projection display device 300 will be explained hereinbelow.

White light (white luminous flux) emitted from the light source 301 is transmitted via the integrator lenses 302 and 303. The light intensity (luminosity distribution) of the white light is made uniform by the integrator lenses 302 and 303. It is preferred that the intensity of the white light emitted from the light source 301 be comparatively high. As a result, brighter image can be formed on a screen 320. Furthermore, because the liquid crystal panel 1B with excellent light resistance is used in the projection display device 300, excellent long-term stability can be obtained even when the intensity of light emitted from the light source 301 is high.

The white light that was transmitted through the integrator lenses 302 and 303 is reflected by the mirror 304 to the left, as shown in FIG. 10, and blue light (B) and green light (G) of this reflected light are reflected down, as shown in FIG. 10, by respective dichroic mirrors 305. The red light (R) is transmitted through the dichroic mirror 305.

The red light that was transmitted through the dichroic mirror 305 is reflected down, as shown in FIG. 10, by the mirror 306, and this reflected light is shaped by the converging lens 310 and falls on the liquid crystal light valve 24 for red color.

The green light of the blue light and green light, which were reflected by the dichroic mirror 305, is reflected to the left, as shown in FIG. 10, by the dichroic mirror 307, and the blue light is transmitted through the dichroic mirror 307.

The green light reflected by the dichroic mirror 307 is shaped by the converging lens 311 and falls on the liquid crystal light valve 25 for green color.

Further, the blue light that was transmitted through the dichroic mirror 307 is reflected to the left, as shown in FIG. 10, by the dichroic mirror (or mirror) 308, and this reflected light is reflected up, as shown in FIG. 10, by the mirror 309. The blue light is shaped by the converging lenses 312, 313, and 314 and falls on the liquid crystal light valve 26 for blue color.

Thus, the white light emitted from the light source 301 is color separated into three primary colors (red, green, and blue) by the color separation optical system and guided to fall on the respective liquid crystal light valves.

At this time, each pixel (thin-film transistor 173 and pixel electrode 172 connected thereto) of the liquid crystal panel 1B of the liquid crystal light valve 24 is switching controlled (ON/OFF), that is, modulated, by a drive circuit (drive means) actuated based on the image signal for red color.

Similarly, the green color and blue color fall on the liquid crystal light valve 25 and liquid crystal light valve 26, respectively, and are modulated by respective liquid crystal panels 1B. As a result, an image for green color and an image for blue color are formed. At this time, each pixel of the liquid crystal panel 1B of the liquid crystal light valve 25 is switching controlled by the drive circuit actuated based on the image signal for green color, and each pixel of the liquid crystal panel 1B of the liquid crystal light valve 26 is switching controlled by the drive circuit actuated based on the image signal for blue color.

In this case, the red light, green light, and blue light are modulated by liquid crystal light valves 24, 25, and 26, respectively, thereby forming an image for red light, an image for green light, and an image for blue light, respectively.

The image for red light formed by the liquid crystal light valve 24, that is, the red light from the liquid crystal light valve 24, falls from the surface 213 on the dichroic prism 21, is reflected to the left, as shown in FIG. 10, by the dichroic mirror surface 211 and transmitted through the dichroic mirror surface 212, and outgoes from the outgoing surface 216.

Further, the image for green light formed by the liquid crystal light valve 25, that is, the green light from the liquid crystal light valve 25, falls from the surface 214 on the dichroic prism 21, is transmitted through the dichroic mirror surfaces 211 and 212, and outgoes from the outgoing surface 216.

Further, the image for blue light formed by the liquid crystal light valve 26, that is, the blue light from the liquid crystal light valve 26, falls from the surface 215 on the dichroic prism 21, is reflected to the left, as shown in FIG. 10, by the dichroic mirror surface 212 and transmitted through the dichroic mirror surface 211, and outgoes from the outgoing surface 216.

The images formed by lights of each color from the liquid crystal light valves 24, 25, and 26, that is, by the liquid crystal light valves 24, 25, and 26, are synthesized by the dichroic prism 21 and a color image is thus formed. This image is projected (enlarged projection) by the projection lens 22 on the screen 320 disposed in the prescribed location.

In addition to the personal computer (mobile personal computer) shown in FIG. 7, cellular phone shown in FIG. 8, digital still camera shown in FIG. 9, and the projection display device shown in FIG. 10, the examples of the electronic devices in accordance with the present invention include television sets, video cameras, viewfinders, video tape recorders of a direct viewing monitor type, vehicle navigation devices, pagers, electronic notebooks (including those provided with communication functions), electronic dictionaries, electronic calculators, electronic game devices, word processors, workstations, TV phones, television monitors for crime prevention, electronic binoculars, POS terminals, devices equipped with touch panels (for example, cash dispensers of financial institutions, automatic machines for selling tickets), medical equipment (for example, electronic body thermometers, blood pressure meters, blood sugar meters, electrocardiograph display devices, ultrasonic diagnostic devices, display devices for endoscopy), fish finders, various measurement devices, instruments (for example, instruments for vehicles, aircrafts, and ships), and flight simulators. It goes without saying that the above-described liquid crystal panel in accordance with the present invention can be used as a display unit and monitor unit of those electronic devices.

The above-described oriented film, substrate for an electronic device, liquid crystal panel, electronic device, and method for forming an oriented film in accordance with the present invention were described based on the embodiments thereof illustrated by the appended drawings, but the present invention is not limited thereto.

For example, the method for forming an oriented film in accordance with the present invention may additionally include one or several steps implemented with any object. Further, for example, in the substrate for an electronic device, liquid crystal panel, and electronic device in accordance with the present invention, the configuration of each component can be replaced with any configuration demonstrating identical functions, or any additional configuration may be employed.

Further, in the above-described embodiment, the explanation was conducted with respect to a projection display device (electronic device) having three liquid crystal panels, wherein the liquid crystal panel in accordance with the present invention (liquid crystal panel comprising a photostabilizing agent in the oriented film) was employed for all those liquid crystal panels. However, the liquid crystal panel in accordance with the present invention may be used in at least one of them. In this case, the present invention is preferably employed in the liquid crystal panel used in the liquid crystal light valve for blue color.

EXAMPLES

Manufacture of Liquid Crystal Panel

The liquid crystal panel shown in FIG. 6 was manufactured in the following manner.

Working Example 1

First, a microlens substrate was manufactured in the following manner.

A non-processed quartz glass substrate (transparent substrate) with a thickness of about 1.2 mm was prepared as a starting material. It was immersed in a cleaning solution (liquid mixture of sulfuric acid and aqueous hydrogen peroxide) at a temperature of 85° C. and the surface thereof was cleaned.

Polycrystalline silicon films with a thickness of 0.4 μm were thereafter formed on the front and rear surfaces of the quartz glass substrate by a CVD method.

Openings corresponding, to the recesses that will be formed were then formed in the polycrystalline silicon films thus formed.

This was done in the following manner. First, a resist layer having a pattern of recesses that will be formed was formed on the polycrystalline silicon films. Then, dry etching with CF gas was then carried out with respect to the polycrystalline silicon films and openings were formed. The resistance layer was then removed.

Recesses were then formed on the quartz glass substrate by immersing the quartz glass substrate for 120 min into an etching solution (mixed aqueous solution containing 10 wt. % hydrofluoric acid+10 wt. % glycerin) and wet etching (etching temperature 30° C.) was conducted.

A substrate with recesses for microlenses was then obtained by immersing the quartz glass substrate for 5 min into a 15 wt. % aqueous solution of tetramethyl ammonium hydroxide and removing the polycrystalline silicon films formed on the front and rear surfaces.

The surface of this substrate with recesses for microlenses where the recesses were formed was bubble-free coated with an ultraviolet (UV)-curable acrylic optical adhesive (refractive index 1.60), then a cover glass (surface layer) made from quartz glass was joined to the aforementioned optical adhesive, and a laminated body was then obtained by illuminating the optical adhesive with UV rays and curing the optical adhesive.

A microlens substrate was then obtained by grinding and polishing the cover glass to a thickness of 50 µm.

The thickness of the resin layer in the microlens substrate thus obtained was 12 µm.

A light shielding film (Cr film) with a thickness of 0.16 µm that was provided with openings in the locations corresponding to microlenses of the cover glass, that is, a black matrix, was then formed by using sputtering and photolithography on the microlens substrate obtained in the above-described manner. An ITO film (transparent electrically conductive film) with a thickness of 0.15 µm was then formed by sputtering on the black matrix and a facing substrate (base material) for a liquid crystal panel was manufactured.

An oriented film was then formed in the below-described manner by using the device shown in FIG. 3 on the transparent electrically conductive film of the facing substrate for an liquid crystal panel that was thus obtained.

First, the facing substrate for a liquid crystal panel was disposed on the base material holder D4 located in the vacuum chamber D3 and the pressure inside of the vacuum chamber D3 was then reduced with the evacuation pump D5 to 5×10$^{-5}$ Pa.

Then, nitrogen gas, oxygen gas, and argon gas were supplied at 4 sccm, 4 sccm, and 4 sccm, respectively, from the gas supply source D23 into the ion source D2, a voltage was applied to the filament D21, plasma (ions) was generated, an ion accelerating voltage of 200 V was applied to the draw-out electrode D22, and ions were accelerated and emitted as an ion beam. An oriented film was formed by heating the evaporation source D1 with an electron beam and sublimating carbon simultaneously with the above-descried process. The irradiation angle, $\theta_a$, of the ion beam with respect to the opposing substrate (base material) for a liquid crystal panel was 85°. Further, the temperature of the opposing substrate for a liquid crystal panel during film formation was 80° C. The film formation rate was 2 nm/min. The average thickness of the oriented film obtained was 30 nm. Further, the content ratio of carbon atoms in the oriented film obtained was 70 at. %, the content ratio of nitrogen was 10 at. %, and the content ratio of oxygen was 20 at. %. The ion beam current was 50 mA.

A film was also formed in the same manner as described above on the surface of a TFT substrate (made from quartz glass) that was prepared separately.

A facing substrate for a liquid crystal panel, which had the oriented film formed thereon, was obtained as described hereinabove.

Further, a TFT substrate, which had the oriented film formed thereon, was obtained in a similar manner.

The facing substrate for a liquid crystal panel, which had the oriented film formed thereon, and the TFT substrate, which had the oriented film formed thereon, were joined via a sealing material. This joining was so conducted that the orientation direction of the oriented films was shifted by 90° so that the liquid crystal molecules constituting the liquid crystal layer were twisted to the left.

Then, liquid crystals (manufactured by Merck Co., MJ99247) were introduced through a sealing hole of the gap into the gap formed between the oriented film—oriented film, and this sealing hole was then closed. The thickness of the obtained liquid crystal layer was about 3 µm.

A TFT liquid crystal panel with the structure shown in FIG. 6 was then manufactured by joining the polarizing film 8B and polarizing film 7B to the outer surface side of the facing substrate for a liquid crystal panel and the outer surface side of the TFT substrate, respectively. Films composed of polyvinyl alcohol (PVA) and subjected to uniaxial stretching were used as the polarizing films. The joining direction of the polarizing film 7B and polarizing film 8B was determined based on the orientation direction of the oriented film 3B and oriented film 4B. Thus, the polarizing film 7B and polarizing film 8B were so joined that the incident light was not transmitted when voltage was applied and the incident light was transmitted when no voltage was applied.

The pretilt angle of the manufactured liquid crystal panel was within a range of 3-7°.

Working Examples 2-4

Liquid crystal panels were manufactured in the same manner as in Working example 1, except that the conditions shown in Table 1 were employed when the oriented films were formed.

Comparative Example 1

A liquid crystal panel was manufactured in the same manner as in the above-described Working Example 1, except that the apparatus shown in FIG. 3 was not used, a solution (manufactured by Japan Synthetic Rubber Co., Ltd.) of a polyimide resin (PI) was prepared, a film with an average thickness of 50 nm was formed on the transparent electrically conductive film of the facing substrate for a liquid crystal panel, and an oriented film was obtained by conducting rubbing so that the pretilt angle became 2-3°.

Further, in Comparative Example 1, dust was generated during rubbing.

Comparative Example 2

A liquid crystal panel was manufactured in the same manner as in the above-described Working Example 1, except that the transparent electrically conductive film was irradiated with an ion beam from the perpendicular direction when the oriented film was formed.

Comparative Example 3

A liquid crystal panel was manufactured in the same manner as in the above-described Working Example 1, except that the transparent electrically conductive film was not irradiated with an ion beam when the oriented film was formed.

Table 1 shows various conditions that were employed when the oriented films were formed. Table 2 shows the composition (content of carbon, nitrogen, and oxygen) and mean thickness of the oriented film, and a pretilt angle in each liquid crystal panel.

panel manufactured in Comparative Example 1 to decrease to 50% of the initial optical transmittance, this time being measured from the start of illumination, was selected as a reference.

⊙: Light resistance interval is not less than 5 times longer than that of Comparative Example 1.

○: Light resistance interval is not less than 2 times and less than 5 times longer than that of Comparative Example 1.

Δ: Light resistance interval is not less than 1 time and less than 2 times longer than that of Comparative Example 1.

x: Light resistance interval is shorter than that of Comparative Example 1.

TABLE 1

|  | Composition of gas supplied into ion source [sccm] | | | Pressure inside vacuum chamber | Irradiation angle of ion beam, | Accelerating voltage | Ion beam current | Base material temperature | Film formation rate |
|---|---|---|---|---|---|---|---|---|---|
|  | Nitrogen | Oxygen | Argon | [Pa] | $\theta_a$ [°] | [V] | [mA] | [°] | [nm/min] |
| Working Example 1 | 4 | 4 | 4 | $5 \times 10^{-2}$ | 85 | 200 | 50 | RT | 20. |
| Working Example 2 | 4 | 6 | 2 | $5 \times 10^{-2}$ | 85 | 200 | 50 | RT | 1.8 |
| Working Example 3 | 4 | 2 | 6 | $5 \times 10^{-2}$ | 85 | 200 | 50 | RT | 1.5 |
| Working Example 4 | 6 | 4 | 2 | $5 \times 10^{-2}$ | 85 | 200 | 50 | RT | 1.3 |
| Comparative Example 1 | — | — | — | — | — | — | — | — | — |
| Comparative Example 2 | 4 | 4 | 4 | $5 \times 10^{-2}$ | 0 | 200 | 50 | RT | 2.0 |
| Comparative Example 3 | — | — | — | $5 \times 10^{-2}$ | — | — | — | RT | 2.0 |

TABLE 2

|  | Composition of inorganic oriented film [at. %] | | | Average thickness of oriented film | Pretilt angle |
|---|---|---|---|---|---|
|  | Nitrogen | Oxygen | Argon | [nm] | [°] |
| Working Example 1 | 70 | 10 | 20 | 30 | 3-7 |
| Working Example 2 | 65 | 20 | 15 | 50 | 3-7 |
| Working Example 3 | 80 | 15 | 5 | 50 | 3-7 |
| Working Example 4 | 85 | 5 | 10 | 50 | 3-7 |
| Comparative Example 1 | — | — | — | 50 | 2-3 |
| Comparative Example 2 | 70 | 10 | 20 | 30 | 0-1 |
| Comparative Example 3 | 100 | — | — | 30 | 0 |

Measurements on the oriented films formed in each working example were conducted by x-ray photoelectron spectroscopy and Raman spectroscopy and π bonds were confirmed.

Optical transmittance of the liquid crystal panels manufactured in the above-described working examples and comparative examples was continuously measured. Measurements of the optical transmittance were conducted by holding the liquid crystal panels at a temperature of 50° C. and illuminating with white light with a luminous flux density of 15 lm/mm² in a state without voltage application.

The liquid crystal panels were evaluated by the following four levels, where the interval (light resistance interval) required for the optical transmittance of the liquid crystal Evaluation of Liquid Crystal Projector (Electronic Device)

Liquid-crystal projectors (electronic devices) with the structure shown in FIG. 10 were assembled by using TFT liquid crystal panels manufactured in the working examples and comparative examples and then were continuously driven for 5000 h.

In order to evaluate the liquid crystal projectors, projected images in 5000 h after driving were observed and luminosity was evaluated according to the following four levels.

⊙: Bright projected images were observed.

○: Almost bright projected images were observed.

Δ: Projected images with somewhat degraded brightness were observed.

x: Observed projected images were not bright.

The evaluation results are shown in Table 3.

TABLE 3

|  | Light resistance | Luminosity After drive for 5000 h |
|---|---|---|
| Working Example 1 | ⊙ | ⊙ |
| Working Example 2 | ⊙ | ⊙ |
| Working Example 3 | ⊙ | ⊙ |
| Working Example 4 | ⊙ | ⊙ |
| Comparative Example 1 | — | x |
| Comparative Example 2 | ⊙ | Δ |
| Comparative Example 3 | ⊙ | Δ |

Table 3 clearly shows that the liquid crystal panels in accordance with the present invention demonstrate light resistance superior to that of the liquid crystal panels of Comparative Example 1.

Furthermore, in the liquid crystal panel in accordance with the present invention, a sufficient pretilt angle was obtained and the orientation state of liquid crystal molecules could be reliably controlled, but in the liquid crystal panels of Comparative Examples 2 and 3, a sufficient pretilt angle was not obtained and the orientation state of liquid crystal molecules was difficult to control.

As a result, with the liquid-crystal projectors (electronic device) manufactured by using the liquid crystal panel of Working Examples 1 to 4, bright projected images were produced even after continuous operation for a long time.

By contrast, in the liquid-crystal projector manufactured by using the liquid crystal panel of Comparative Example 1, a bright projected image was obtained at the initial stage, but after 5000 h, the luminosity of the projected image clearly decreased. This was apparently because at the initial stage the orientation of liquid crystal molecules was ordered, but in long-term operation the oriented film deteriorated and orientation ability of liquid crystal molecules was degraded.

Further, when a personal computer, a cellular phone, and a digital still camera comprising the liquid crystal panel in accordance with the present invention were fabricated and evaluated in a similar manner, similar results were obtained.

Those results demonstrate that the liquid crystal panel and electronic device in accordance with the present invention have excellent light resistance and allow stable characteristics to be obtained even in long-term use.

What is claimed is:

1. A method for forming an oriented film on a base material for a liquid crystal device having a liquid crystal therein, comprising steps of:
    irradiating a surface of said base material with an ion beam comprising nitrogen ions from a direction inclined at a prescribed angle, $\theta_a$, with respect to a direction perpendicular to said surface, and simultaneously evaporating carbon from an evaporation source to deposit on the surface being irradiated while performing said irradiating step to form the oriented film,
    wherein the oriented film has unsaturated C—N bonds and a plurality of $\pi$ electron orbitals formed on a surface of the oriented film at a predetermined pretilt angle, said $\pi$ electron orbitals interacting with the liquid crystal to to orient the liquid crystal.

2. The method for forming an oriented film according to claim 1, wherein said prescribed angle, $\theta_a$, is about 45-89°.

3. The method for forming an oriented film according to claim 1, wherein an accelerating voltage of said ion beam comprising said nitrogen ions is about 100-500 V.

4. The method for forming an oriented film according to claim 1, wherein an electric current of said ion beam comprising said nitrogen ions is about 10-500 mA.

5. The method for forming an oriented film according to claim 1, wherein a pressure of an atmosphere near said surface during formation of the oriented film is about $5 \times 10^{-2}$ Pa.

6. The method for forming an oriented film according to claim 1, further comprising irradiating said surface of said base material with an ion beam comprising oxygen ions from a direction inclined at a prescribed angle, $\theta_b$, with respect to the direction perpendicular to said surface.

7. The method for forming an oriented film according to claim 6, wherein said angle $\theta_a$ and said angle $\theta_b$ are substantially equal to each other.

8. The method for forming an oriented film according to claim 1, wherein the oriented film is formed at a rate of about 2-10 nm/min.

* * * * *